(12) United States Patent
Xue et al.

(10) Patent No.: US 9,754,864 B1
(45) Date of Patent: Sep. 5, 2017

(54) SEMICONDUCTOR POWER DEVICE HAVING SINGLE IN-LINE LEAD MODULE AND METHOD OF MAKING THE SAME

(71) Applicant: Alpha and Omega Semiconductor Incorporated, Sunnyvale, CA (US)

(72) Inventors: Yan Xun Xue, Los Gatos, CA (US); Zhiqiang Niu, Santa Clara, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/191,414

(22) Filed: Jun. 23, 2016

(51) Int. Cl.
*H01L 23/48* (2006.01)
*H01L 23/495* (2006.01)
*H01L 23/31* (2006.01)
*H01L 21/48* (2006.01)
*H01L 21/56* (2006.01)
*H01L 21/78* (2006.01)
*H01L 23/00* (2006.01)

(52) U.S. Cl.
CPC .... *H01L 23/49562* (2013.01); *H01L 21/4853* (2013.01); *H01L 21/565* (2013.01); *H01L 21/78* (2013.01); *H01L 23/3121* (2013.01); *H01L 23/49555* (2013.01); *H01L 23/49575* (2013.01); *H01L 24/90* (2013.01)

(58) Field of Classification Search
CPC .............. H01L 23/4853; H01L 23/4952; H01L 23/49555; H01L 23/49575; H01L 23/49562; H01L 23/49805; H01L 23/493142; H01L 23/49524
See application file for complete search history.

(56) References Cited

U.S. PATENT DOCUMENTS

| | | | |
|---|---|---|---|
| 8,754,510 B2* | 6/2014 | Minamio | H01L 23/49575 257/666 |
| 9,595,503 B2* | 3/2017 | Kuo | H01L 23/4952 |
| 9,607,940 B2* | 3/2017 | Yato | H01L 23/49805 |

* cited by examiner

*Primary Examiner* — Cuong Q Nguyen
(74) *Attorney, Agent, or Firm* — Chen-Chi Lin

(57) ABSTRACT

A semiconductor power device is disclosed. The semiconductor power device comprises a lead frame unit, two or more pluralities of single in-line leads, two or more semiconductor chip stacks, and a molding encapsulation. Each semiconductor chip stack includes a high-side semiconductor chip, a low-side semiconductor chip and a clip connecting a top surface of the high-side semiconductor chip to a bottom surface of the low-side semiconductor chip. This invention further discloses a method for fabricating semiconductor power devices. The method comprises the steps of providing a lead frame strip having a plurality of lead frame units; providing two or more pluralities of single in-line leads; attaching two or more high-side semiconductor chips to each lead frame unit; connecting each of the two or more high-side semiconductor chips to a respective lead by a respective clip of two or more first clips; attaching a respective low-side semiconductor chip of the two or more low-side semiconductor chips to each clip of the two or more first clips; molding an encapsulation; and singulating the lead frame strip and the encapsulation to form the semiconductor power devices.

10 Claims, 12 Drawing Sheets

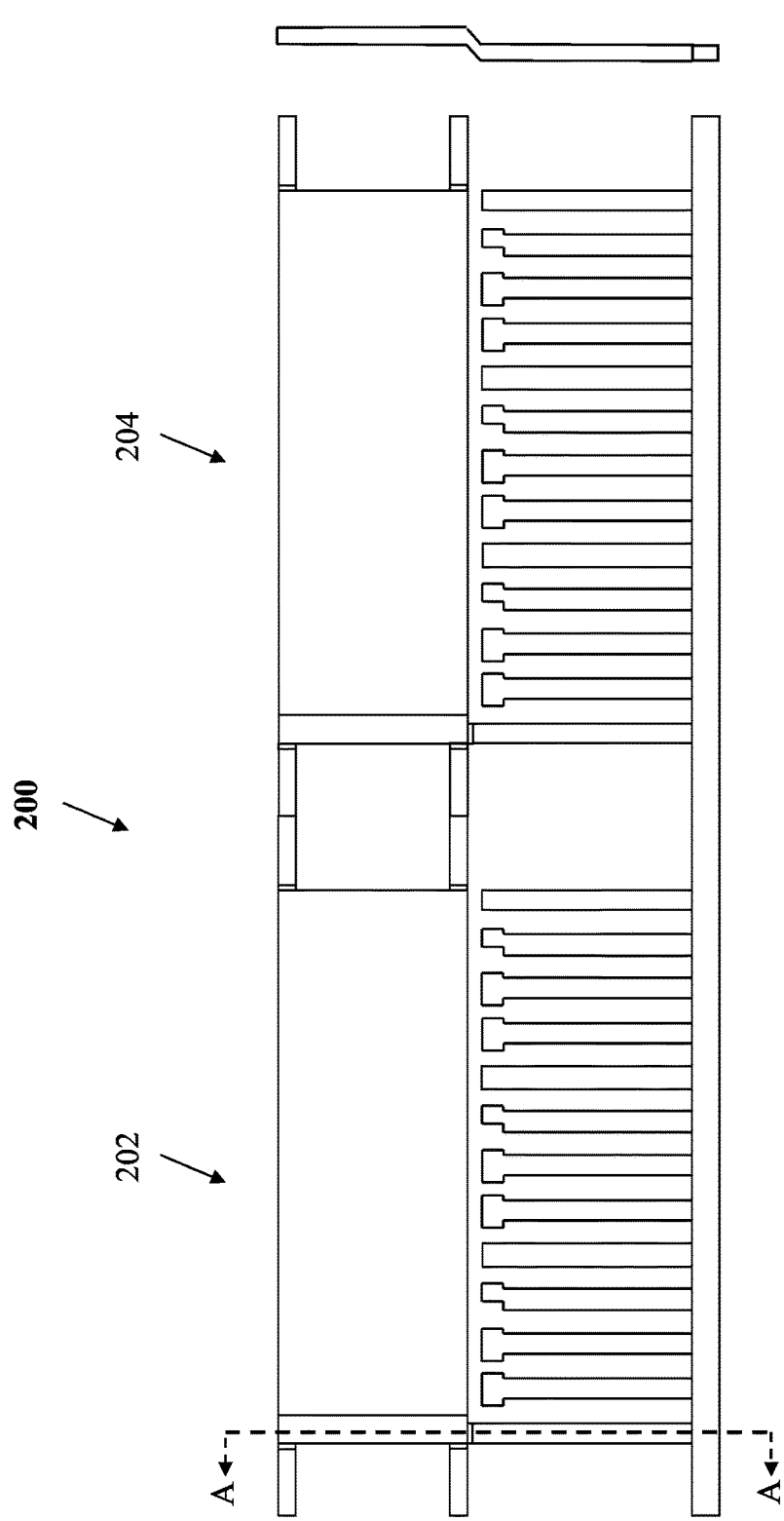

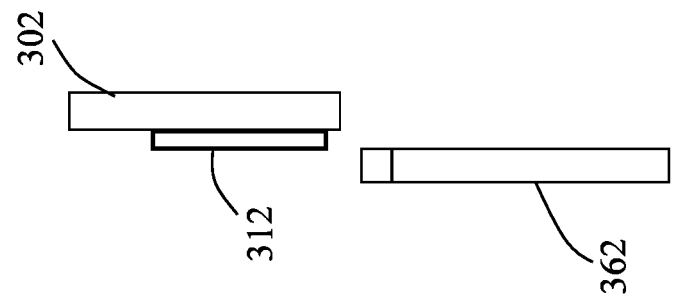
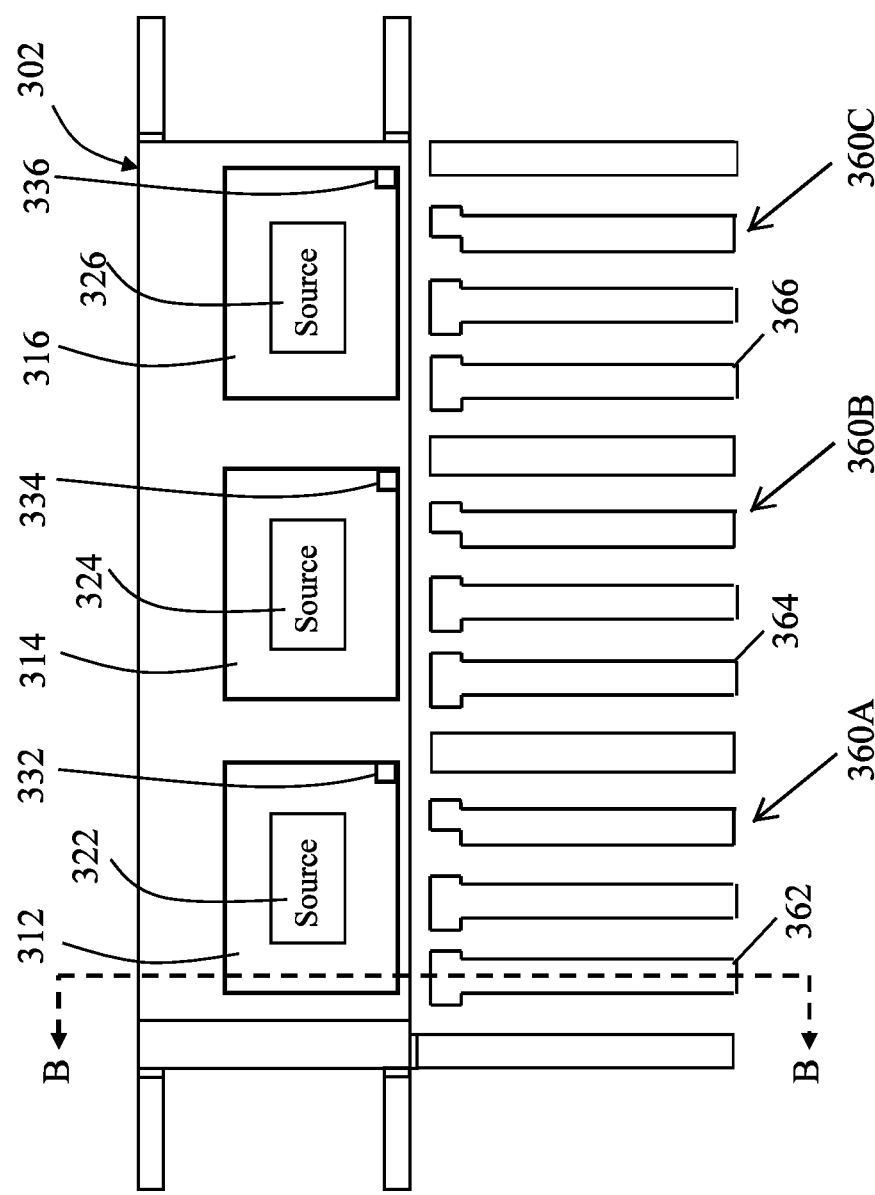
Fig. 3B
Fig. 3A

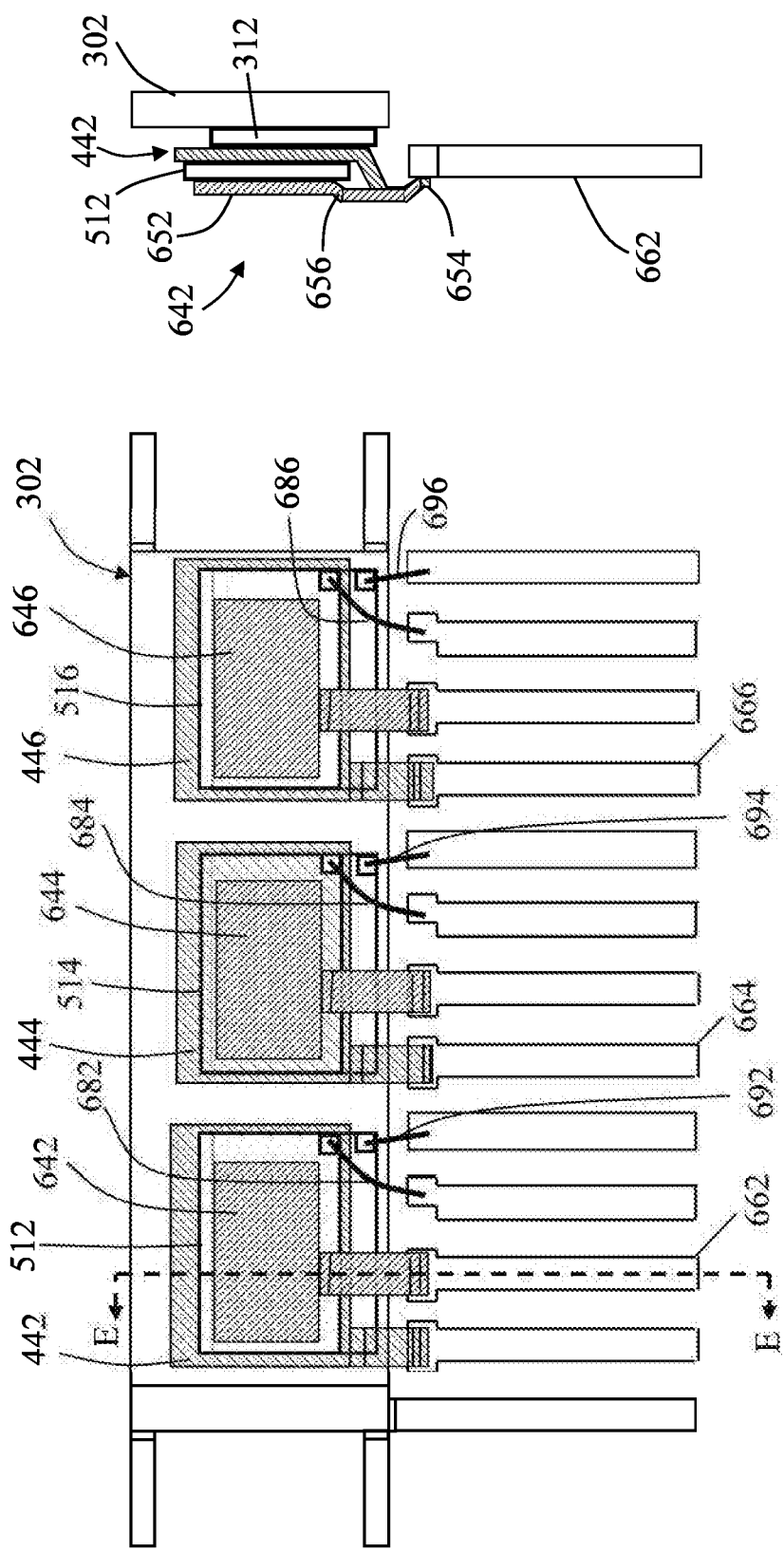

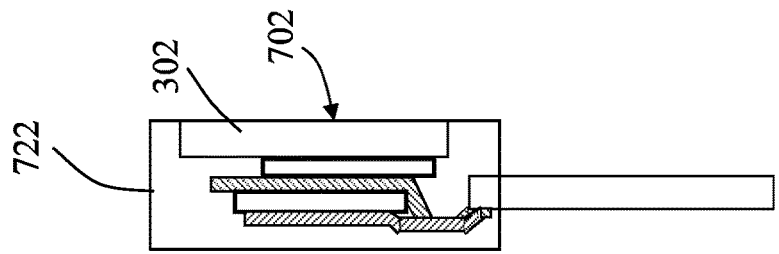
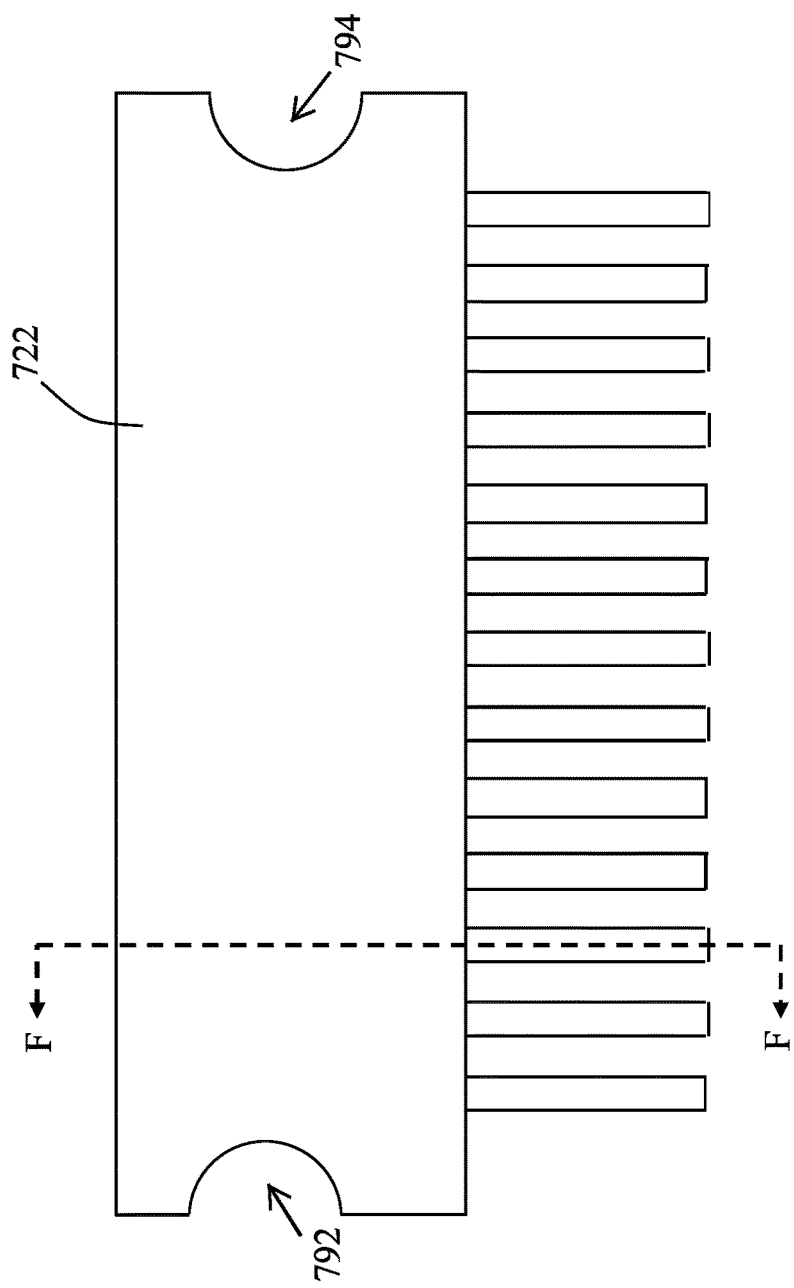
Fig. 7A
Fig. 7B

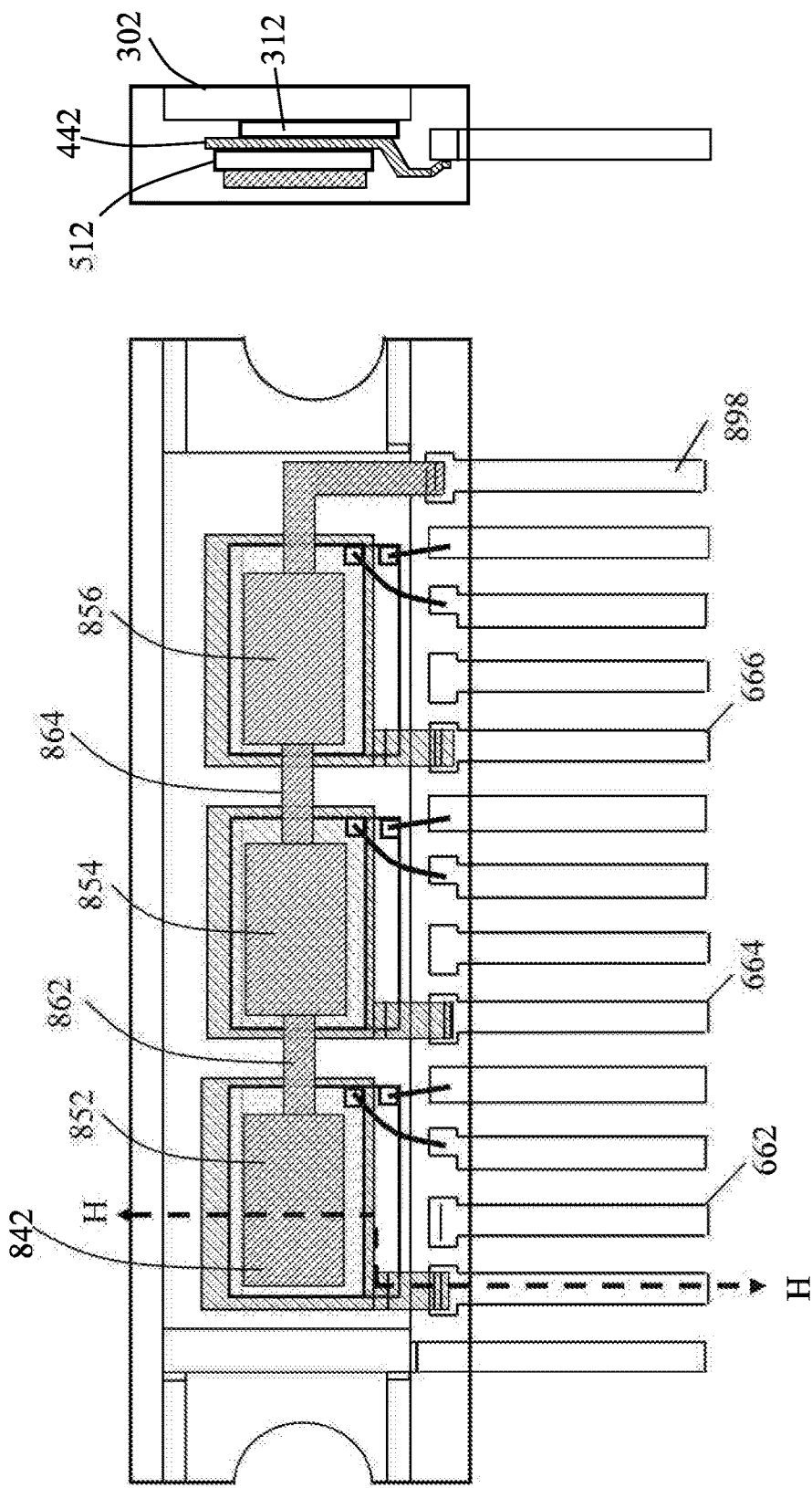

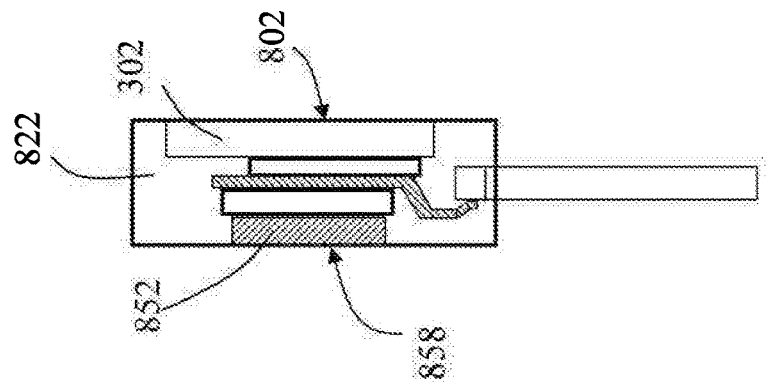
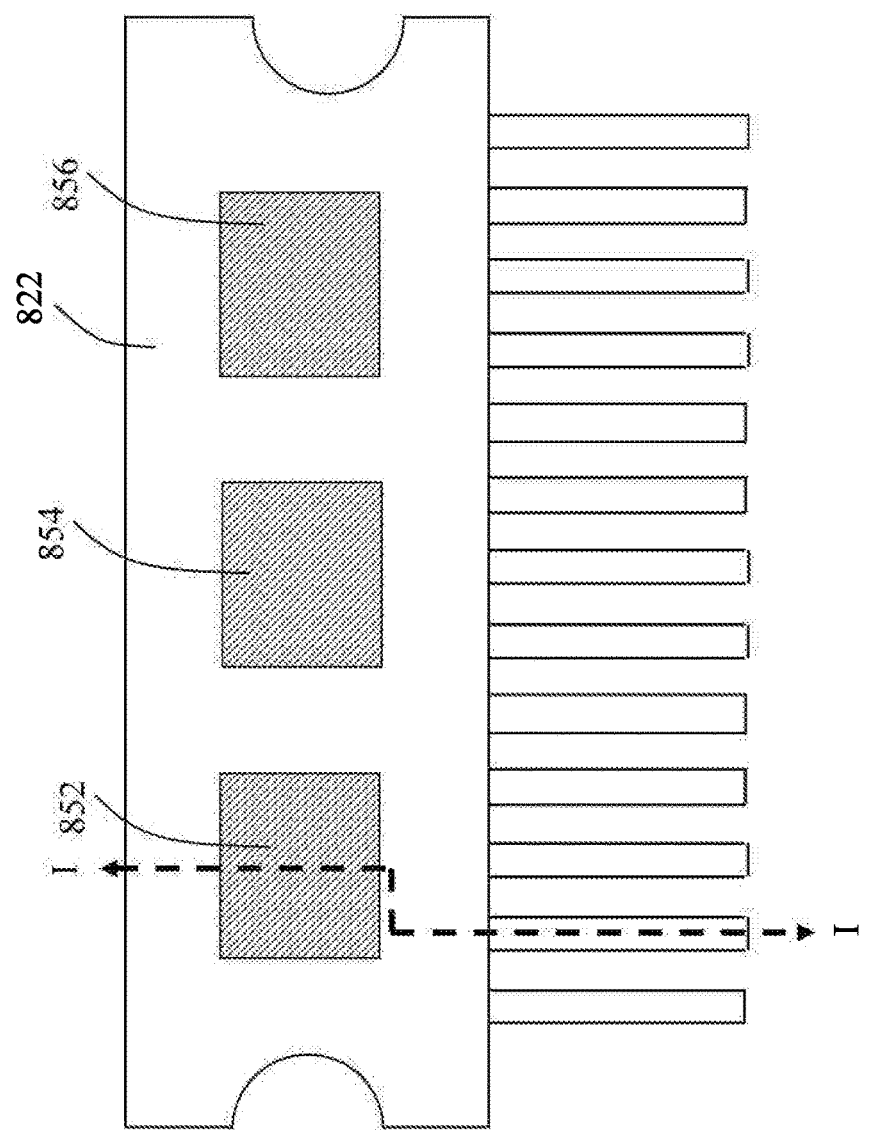
Fig. 8D
Fig. 8C

SEMICONDUCTOR POWER DEVICE HAVING SINGLE IN-LINE LEAD MODULE AND METHOD OF MAKING THE SAME

FIELD OF THE INVENTION

This invention relates generally to a semiconductor power device. More particularly, the present invention relates to a semiconductor power device having single in-line lead module and the method of making the semiconductor power device.

BACKGROUND OF THE INVENTION

An electronic equipment, for example a power tool, may contain several power devices. Conventionally, metal-oxide semiconductor field-effect transistor (MOSFET) chips of those several power devices are fabricated and assembled in several different packages. The MOSFET chips are placed side-by-side. A pre-determined gap width between adjacent MOSFET chips is required to increase heat dissipation. Each package requires a separate pick-and-place process. It is not space efficient nor time efficient in a board level mounting step. It generates excessive impedance from board level interconnection.

The present disclosure discloses a semiconductor power device having semiconductor chip stacks. Each chip stack contains a high-side MOSFET chip, a low-side MOSFET chip and a clip connecting a source pad of the high-side MOSFET chip to a drain pad of the low-side MOSFET chip. In one example, clip interconnection is applied to a main power path, for example a source path or a drain path of a MOSFET chip of an N-channel module. In another example, a top surface of a clip is exposed from an encapsulation and a bottom surface of a lead frame unit is exposed from the encapsulation. It reduces the number of the pick-and-place processes. It is more space efficient and time efficient in a board level mounting step.

SUMMARY OF THE INVENTION

This invention discloses a semiconductor power device comprising a lead frame unit, two or more pluralities of single in-line leads, two or more semiconductor chip stacks and a molding encapsulation. Each semiconductor chip stack includes a high-side semiconductor chip, a low-side semiconductor chip and a clip connecting a top surface of the high-side semiconductor chip to a bottom surface of the low-side semiconductor chip.

This invention further discloses a method for fabricating semiconductor power devices. The method comprises the steps of providing a lead frame strip having a plurality of lead frame units; providing two or more pluralities of single in-line leads; attaching two or more high-side semiconductor chips to each lead frame unit; connecting each of the two or more high-side semiconductor chips to a respective lead by a respective clip of two or more first clips; attaching a respective low-side semiconductor chip of the two or more low-side semiconductor chips to each clip of the two or more first clips; molding an encapsulation; and singulating the lead frame strip and the encapsulation to form the semiconductor power devices.

BRIEF DESCRIPTION OF THE DRAWINGS

FIG. 2A is a top view and FIG. 2B is a cross-sectional view perpendicular to AA plane of a lead frame strip in examples of the present disclosure.

FIGS. 3A, 4A, 5A, 6A, 7A and 7C are a series of top views and FIGS. 3B, 4B, 5B, 6B, 7B and 7D are a series of cross-sectional views perpendicular to BB, CC, DD, EE, FF and GG planes respectively showing various processing steps to fabricate semiconductor power devices in examples of the present disclosure.

FIG. 8A is a top view and FIG. 8B is a cross-sectional view perpendicular to HH plane of a semiconductor power device in examples of the present disclosure.

FIG. 8C is a top view and FIG. 8D is a cross-sectional view perpendicular to II plane of a semiconductor power device in examples of the present disclosure.

DETAILED DESCRIPTION OF THE INVENTION

Figure 1:
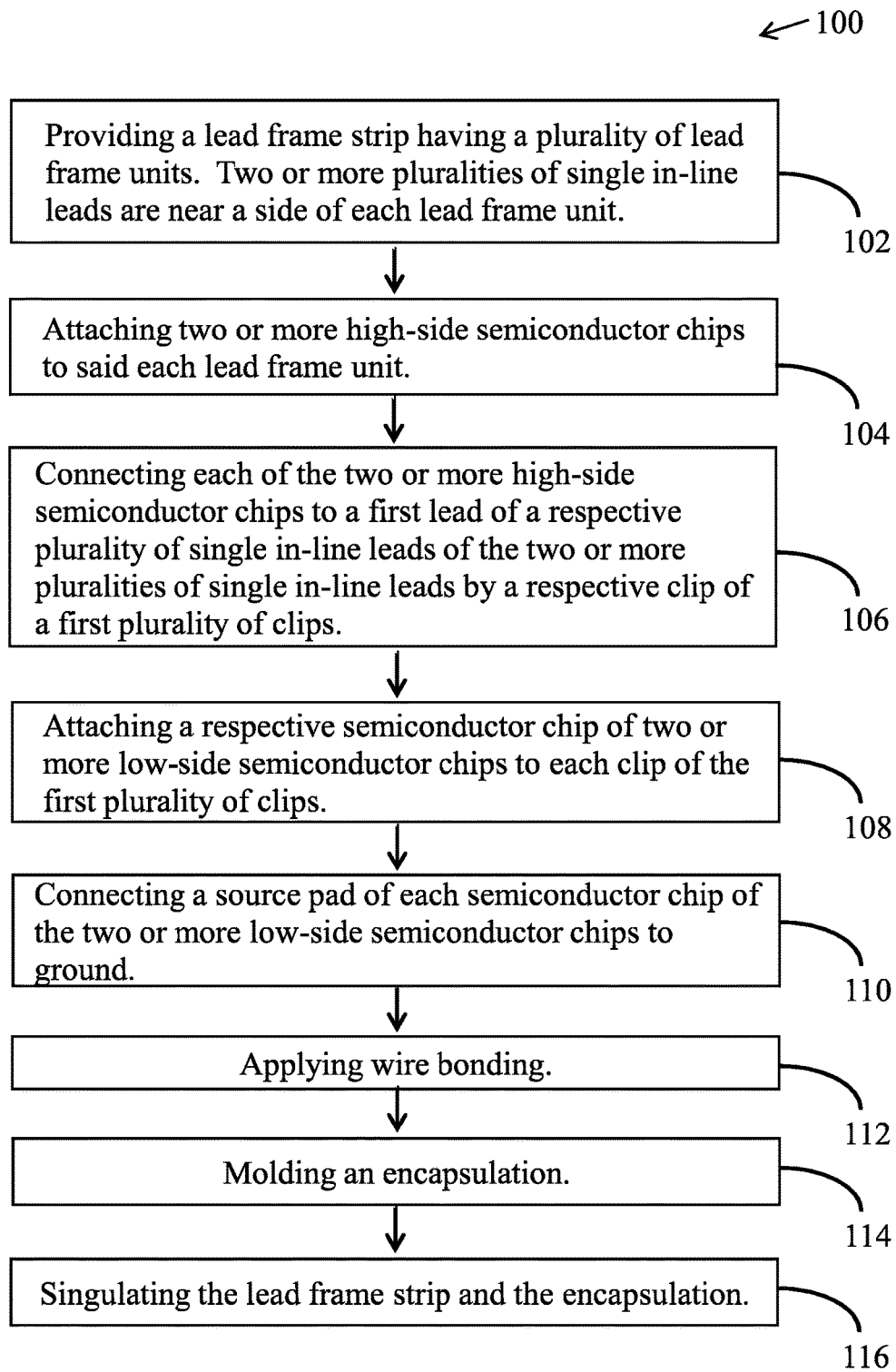
FIG. 1 is a flowchart of a process to fabricate semiconductor power devices in examples of the present disclosure.

FIG. 1 is a flowchart of a process 100 to fabricate semiconductor power devices in examples of the present disclosure. The process 100 may begin in block 102.

In block 102, a lead frame strip 200 of FIG. 2A having a plurality of lead frame units 202 and 204 of FIG. 2A (two lead frame units are shown) is provided.

Two or more pluralities of single in-line leads 360A, 360B and 360C of FIG. 3A (three pluralities of single in-line leads are shown) are near a side of a lead frame unit 302 of FIG. 3A. The plurality of single in-line leads 360A includes a source lead 362 (a first lead). The plurality of single in-line leads 360B includes a source lead 364. The plurality of single in-line leads 360C includes a source lead 366. The lead frame unit 302 is similar to the lead frame unit 202 of FIG. 2A. Portions of the lead frame unit 302 that will be removed during the singulation step in block 116 are not shown in FIG. 3A. Block 102 may be followed by block 104.

In block 104, two or more high-side semiconductor chips 312, 314 and 316 of FIG. 3A (three high-side semiconductor chips are shown) are attached to the lead frame unit 302 through a first layer of conductive bonding material. In examples of the present disclosure, the conductive bonding material is solder paste, epoxy or a silver sintering material. Source pads 322, 324 and 326 of FIG. 3A and gate pads 332, 334 and 336 of FIG. 3A are on top surfaces of the high-side semiconductor chips 312, 314 and 316 respectively. Drain pads are at bottom surfaces of the high-side semiconductor chips 312, 314 and 316 respectively. Block 104 may be followed by block 106.

In block 106, each of the high-side semiconductor chips 312, 314 and 316 is connected to a source lead 362, 364 or 366 (a first lead) of a respective plurality of single in-line leads of the two or more pluralities of single in-line leads 360A, 360B and 360C by a respective clip of two or more first clips 442, 444 and 446. The clip 442 has a first end 452, a bridge 456 and a second end 454. The bridge 456 connects the first end 452 to the second end 454. A bottom surface of the first end 452 is attached to a top surface of the high-side semiconductor chip 312 through a second layer of conductive bonding material. In examples of the present disclosure, the source pad 322 of the high-side semiconductor chip 312 is electrically and mechanically connected to the clip 442. A bottom surface of the second end 454 is attached to a top surface of the source lead 362 through a third layer of conductive bonding material. A region 472 of the top surface of the high-side semiconductor chip 312 is not covered by the clip 442. Therefore, the gate pad 332 is accessible in the wire bonding step of block 112. Similarly, a region 474 of the top surface of the high-side semiconductor chip 314 is not covered by the clip 444 and a region 476 of the top surface of the high-side semiconductor chip 316 is not covered by the clip 446. Block 106 may be followed by block 108.

Figures 5A, 5B:
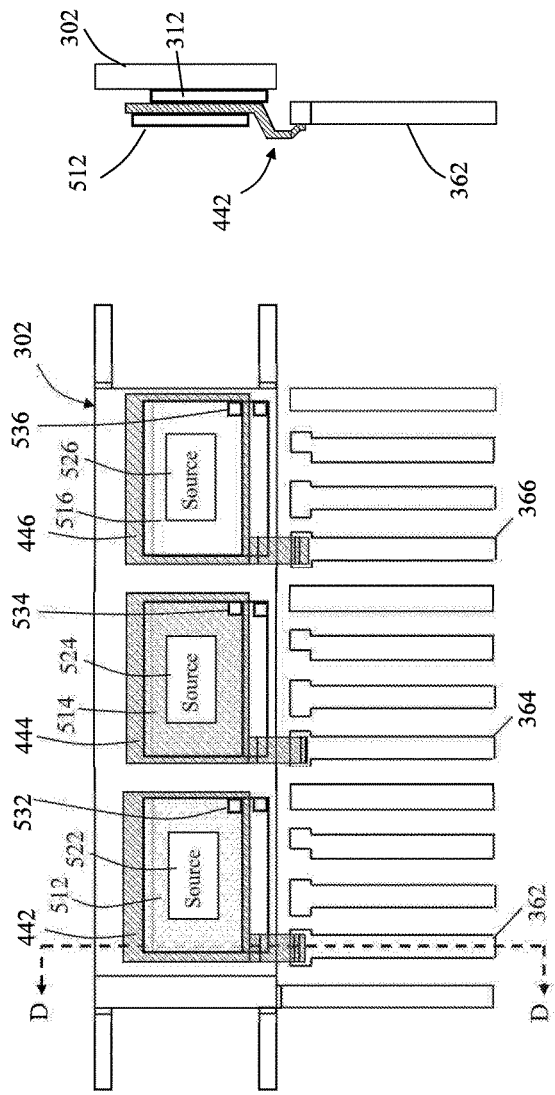

In block 108, a respective semiconductor chip of two or more low-side semiconductor chips 512, 514 and 516 of FIG. 5A (three low-side semiconductor chips are shown) is attached to each clip of the two or more first clips 442, 444 and 446 through a fourth layer of conductive bonding material. Source pads 522, 524 and 526 of FIG. 5A and gate pads 532, 534 and 536 of FIG. 5A are on top surfaces of the low-side semiconductor chips 512, 514 and 516 respectively. Drain pads are at bottom surfaces of the low-side semiconductor chips 512, 514 and 516 respectively. In examples of the present disclosure, the drain of the low-side semiconductor chip 512 is electrically and mechanically connected to the source pad 322 of the high-side semiconductor chips 312 through the first end 452 of the clip 442. Source leads 362, 364 and 366 are also referred as phase note leads since the drains of the low-side semiconductor chips are also connected to the phase note leads through the first clips. In the embodiment, each of the two or more pluralities of single in-line leads 360A, 360B and 360C includes a phase note lead separated from each other. Alternatively, the phase note leads connected to each stack of high-side semiconductor chip and low-side semiconductor chip may connect together or share a common phase note lead (not shown). Block 108 may be followed by block 110.

In block 110, a source pad 522, 524 or 526 of each semiconductor chip of the two or more low-side semiconductor chips 512, 514 and 516 is connected to ground. In examples of the present disclosure, each of the source pad 522, 524 or 526 of the low-side semiconductor chips 512, 514 and 516 is connected to a ground lead 662, 664 or 666 (a second lead) of a respective plurality of single in-line leads of the two or more pluralities of single in-line leads 360A, 360B and 360C by a respective clip of two or more second clips 642, 644 and 646. The clip 642 has a first end 652, a bridge 656 and a second end 654. The bridge 656 connects the first end 652 to the second end 654. A bottom surface of the first end 652 is attached to a top surface of the low-side semiconductor chip 512 through a fifth layer of conductive bonding material. In examples of the present disclosure, the source pad 522 of the low-side semiconductor chip 512 is electrically and mechanically connected to the clip 642. A bottom surface of the second end 654 is attached to a top surface of the ground lead 662 through a sixth layer of conductive bonding material.

In examples of the present disclosure, a linked clip 842 of FIG. 8A connects the source pad 522, 524 or 526 on the top surface of the low-side semiconductor chips 512, 514 and 516 to a ground lead 898 of FIG. 8A of the two or more pluralities of single in-line leads 360A, 360B and 360C. The linked clip 842 has a first section 852 attached to the low-side semiconductor chip 512, a second section 854 attached to the low-side semiconductor chip 514, and a third section 856 attached to the low-side semiconductor chip 516. A connecting member 862 connects the first section 852 to the second section 854. A connecting member 864 connects the second section 854 to the third section 856.

Figure 9:
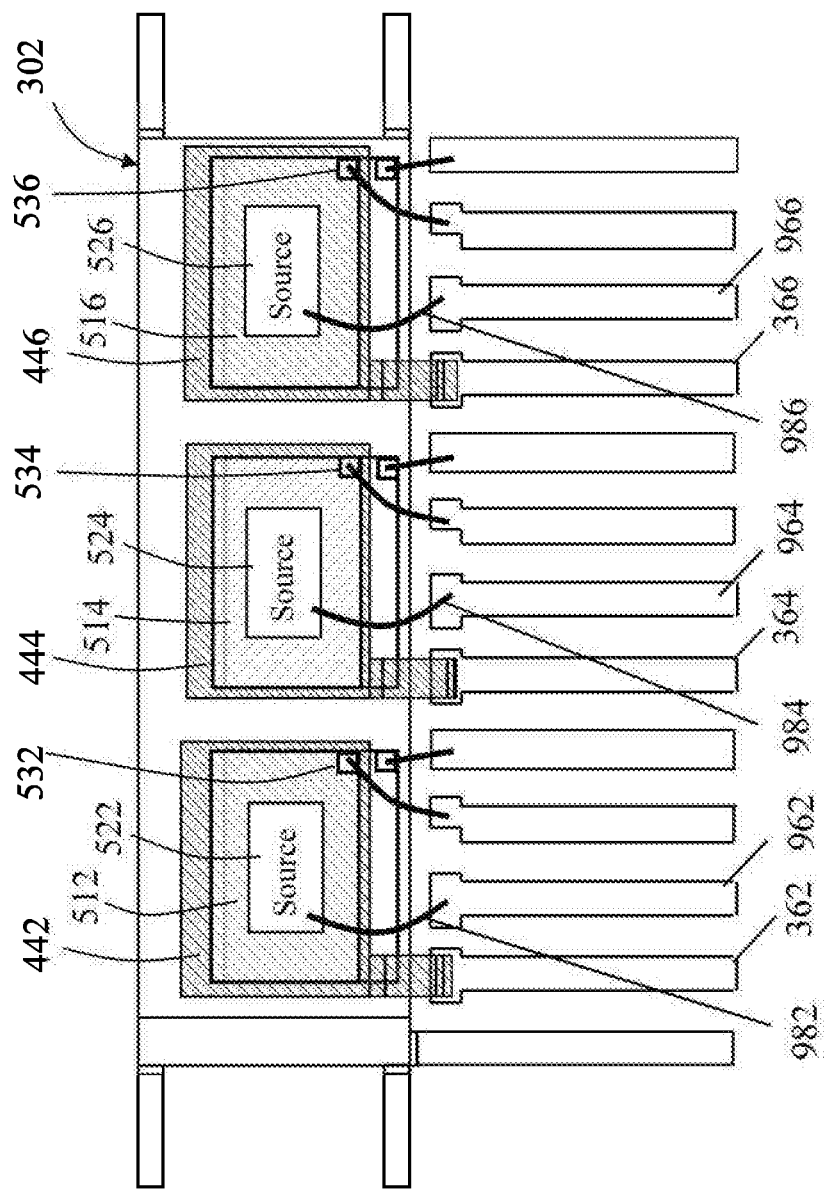
FIG. 9 is a top view of a semiconductor power device in examples of the present disclosure.

In examples of the present disclosure, a respective wire 982, 984 or 986 of FIG. 9 connects the source pad 522, 524 or 526 on the top surface of each of the two or more low-side semiconductor chips 512, 514 and 516 to a ground lead 962, 964 or 966 (a second lead) of the respective plurality of single in-line leads of the two or more pluralities of single in-line leads.

Figure 10:
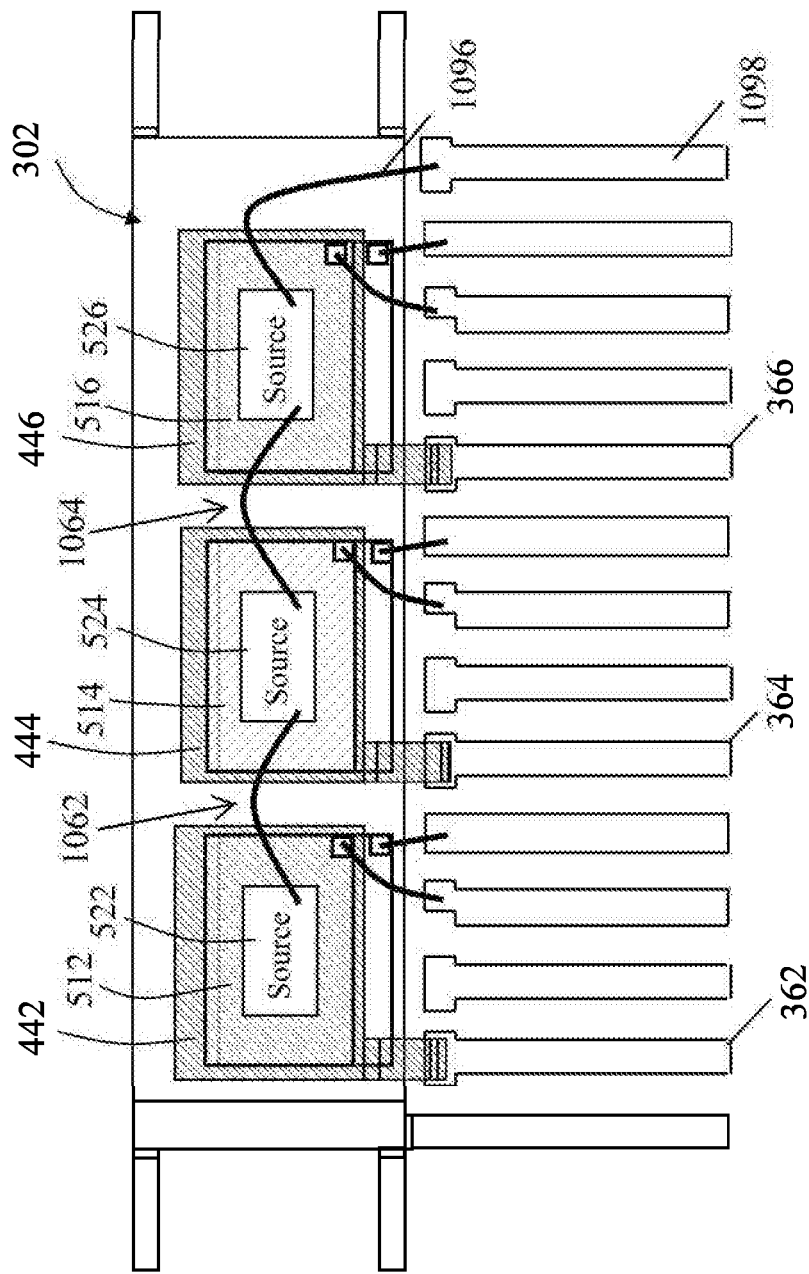
FIG. 10 is a top view of a semiconductor power device in examples of the present disclosure.

In examples of the present disclosure, wire 1062 of FIG. 10 connects the source pad 522 of the low-side semiconductor chip 512 to the source pad 524 of the low-side semiconductor chip 514. Wire 1064 of FIG. 10 connects the source pad 524 of the low-side semiconductor chip 514 to the source pad 526 of the low-side semiconductor chip 516. Wire 1096 of FIG. 10 connects the source pad 526 of the low-side semiconductor chip 516 to a ground lead 1098. Block 110 may be followed by block 112.

In block 112, wire bonding is applied. A first respective wire 692, 694 or 696 of FIG. 6A connects a gate pad 332, 334 or 336 of said each of the two or more high-side semiconductor chips 312, 314 and 316 to a third lead of the respective plurality of single in-line leads of the two or more pluralities of single in-line leads 360A, 360B and 360C. A second respective wire 682, 684 or 686 connects a gate pad 532, 534 or 536 of said each of the two or more low-side semiconductor chips 512, 514 and 516 to a fourth lead of the respective plurality of single in-line leads of the two or more pluralities of single in-line leads 360A, 360B and 360C. Wires 682, 684, 686, 692, 694 and 696 may be replaced. In one example, wire bonding method may be replaced by clip attachments. Wire bonding method is preferred for cost reduction. Clip attachment is preferred when electrical current requirement is critical. Block 112 may be followed by block 114.

Figure 4B:
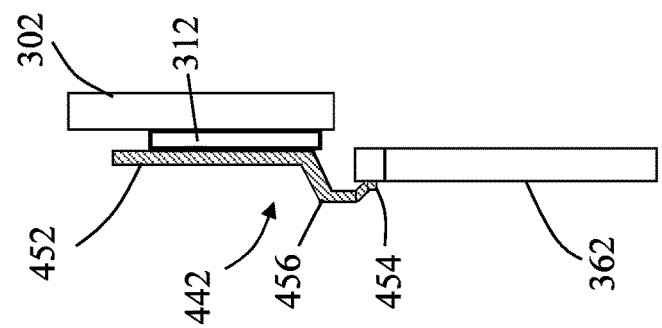
Figure 4A:
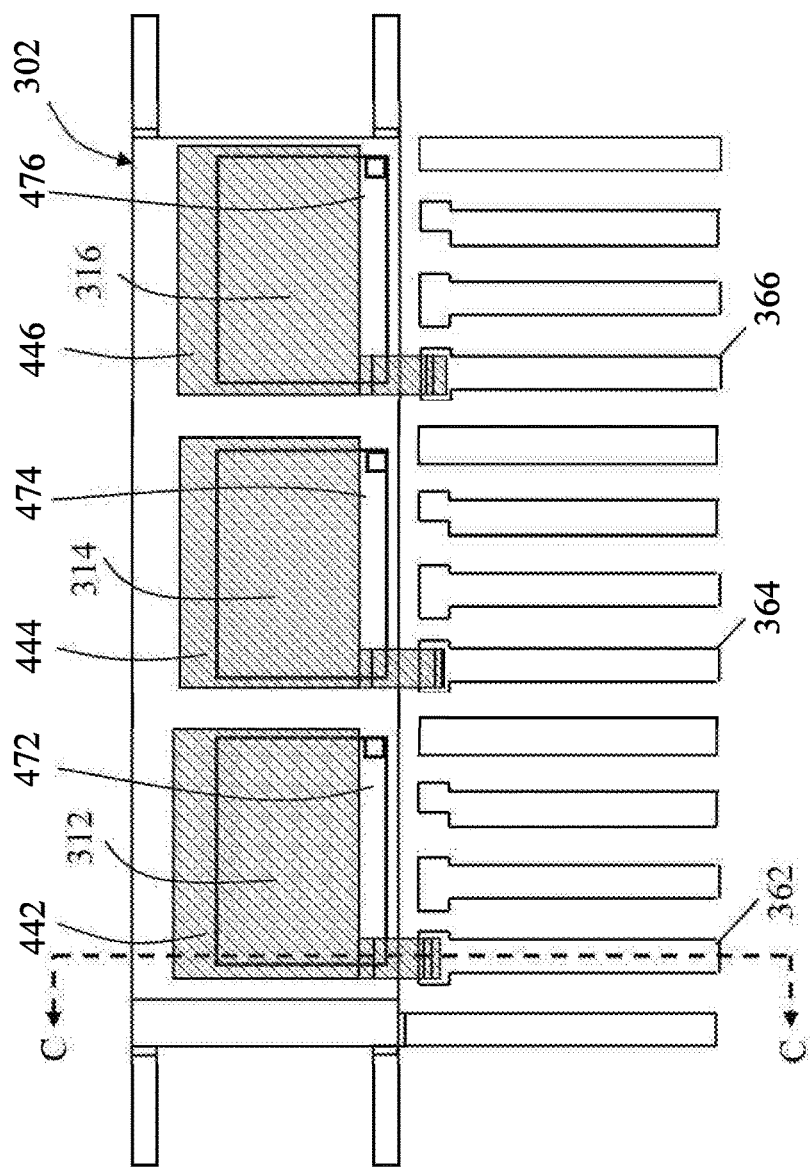

In block 114, an encapsulation 722 of FIG. 7A is molded to cover a top surface of the lead frame strip 200 of FIG. 2A, the two or more high-side semiconductor chips 312, 314 and 316 attached to each lead frame unit 302 of FIG. 3A, the respective clip of the two or more first clips 442, 444 and 446 of FIG. 4A and the respective semiconductor chip of the two or more low-side semiconductor chips 512, 514 and 516.

Figures 7C, 7D:
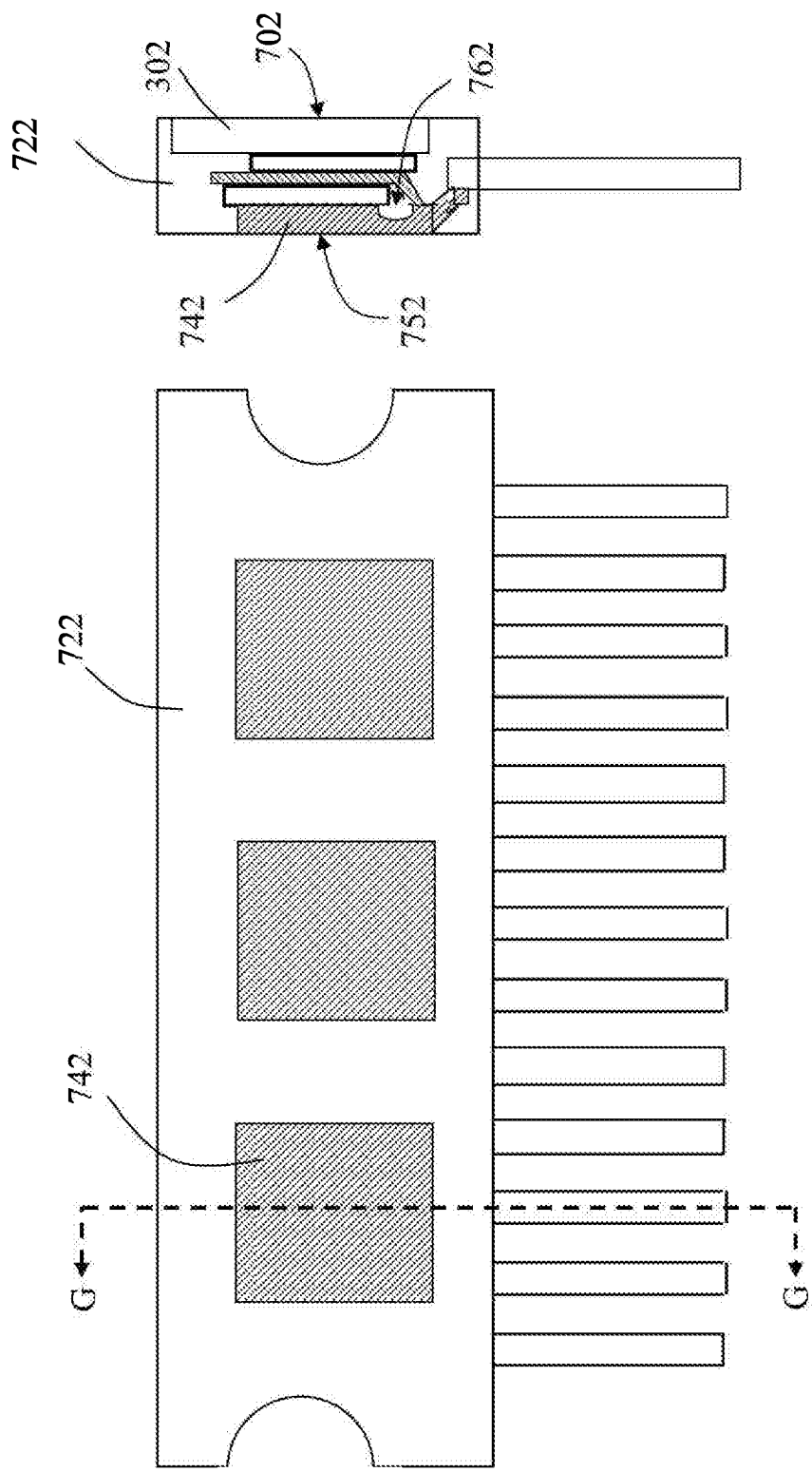

In examples of the present disclosure, at least a majority portion of the respective clip of the two or more second clips 642, 644 and 646 is embedded in the encapsulation 722 of FIGS. 7A and 7B. In one example, a clip is entirely embedded in the encapsulation 722. In another example, a top surface 752 of FIG. 7D of the clip 742 of FIG. 7C and FIG. 7D is exposed from the encapsulation 722. In examples of the present disclosure, a bridge has a notch 762 of FIG. 7D. The bridge connects a first end of the clip 742 to a second end of the clip 742. In one example, a lead frame unit is entirely embedded in the encapsulation 722. In another example, a bottom surface 702 of FIG. 7D of the lead frame unit 302 is exposed from the encapsulation 722. In examples of the present disclosure, half circle cutouts 792 and 794 are formed for screw mounts.

In one example, the linked clip 842 is entirely embedded in the encapsulation. In another example, as shown in FIG. 8C and FIG. 8D, top surfaces of the first section 852, the second section 854, and the third section 856 are exposed from the encapsulation 822. In FIG. 8D, a top surface 858 of the first section is exposed from the encapsulation 822. Block 114 may be followed by block 116.

In block 116, the lead frame strip 200 and the encapsulation 722 are singulated to form the semiconductor power devices. In examples of the present disclosure, a semiconductor power device includes two or more semiconductor chip stacks. In one example, a first chip stack includes the lead frame unit 302, the high-side semiconductor chip 312, the clip 442 and the low-side semiconductor chip 512. The first chip stack may further includes the clip 642. In examples of the present disclosure, the two or more first clips 442, 444 and 446, the two or more second clips 642, 644 and 646, and the linked clip 842 are made of a conductive metal material. In one example, the conductive metal material is copper. In another example, the conductive metal material is nickel.

Those of ordinary skill in the art may recognize that modifications of the embodiments disclosed herein are possible. For example, the elevations of a first and second ends of a clip may vary. Other modifications may occur to those of ordinary skill in this art, and all such modifications are deemed to fall within the purview of the present invention, as defined by the claims.

The invention claimed is:

1. A semiconductor power device comprising:
    a lead frame unit having a top surface and a bottom surface opposite the top surface;
    two or more pluralities of single in-line leads arranged in a row near a side of the lead frame unit;
    two or more semiconductor chip stacks each including
        a high-side semiconductor chip having a top surface and a bottom surface, the bottom surface of the high-side semiconductor chip being attached to the top surface of the lead frame unit through a first layer of conductive bonding material;
        a first clip having a first end and a second end, a bottom surface of the first end of the first clip being attached to a source pad on the top surface of the high-side semiconductor chip through a second layer of conductive bonding material, and a bottom surface of the second end of the first clip being attached to a top surface of a first lead of a respective plurality of single in-line leads of the two or more pluralities of single in-line leads through a third layer of conductive bonding material; and
        a low-side semiconductor chip having a top surface and a bottom surface, the bottom surface of the low-side semiconductor chip being attached to the top surface of the first end of the first clip through a fourth layer of conductive bonding material; and
    a molding encapsulation;
    wherein a source pad on the top surface of the low-side semiconductor chip of said each of the two or more semiconductor chip stacks is electrically and mechanically connected to ground; and
    wherein the high-side and low-side semiconductor chips and the first clip of said each of the two or more semiconductor chip stacks and at least a majority portion of the lead frame unit are embedded in the molding encapsulation.

2. The semiconductor power device of claim 1, wherein the two or more semiconductor chip stacks each further including
    a second clip having a first end and a second end, a bottom surface of the first end of the second clip being attached to the source pad on the top surface of the low-side semiconductor chip through a fifth layer of conductive bonding material, and a bottom surface of the second end of the second clip being attached to a top surface of a second lead of the respective plurality of single in-line leads of the two or more pluralities of single in-line leads through a sixth layer of conductive bonding material;
    wherein the second lead is a ground lead; and
    wherein at least a majority portion of the second clip is embedded in the molding encapsulation.

3. The semiconductor power device of claim 2, wherein a first wire connects a gate pad of the high-side semiconductor chip to a third lead of the respective plurality of single in-line leads of the two or more pluralities of single in-line leads; and
    wherein a second wire connects a gate pad of the low-side semiconductor chip to a fourth lead of the respective plurality of single in-line leads of the two or more pluralities of single in-line leads.

4. The semiconductor power device of claim 2, wherein the bottom surface of the lead frame unit is exposed from the molding encapsulation.

5. The semiconductor power device of claim 2, wherein a top surface of the second clip is exposed from the molding encapsulation.

6. The semiconductor power device of claim 2, wherein a bridge connects the first end of the second clip to the second end of the second clip; and
    wherein the bridge has a notch.

7. The semiconductor power device of claim 1 further comprising a linked clip connecting the source pad on the top surface of the low-side semiconductor chip of each of the two or more semiconductor chip stacks to a ground lead of the two or more pluralities of single in-line leads.

8. The semiconductor power device of claim 7, wherein a top surface of the linked clip is exposed from the molding encapsulation.

9. The semiconductor power device of claim 1, wherein a respective wire connects the source pad on the top surface of the low-side semiconductor chip of each of the two or more semiconductor chip stacks to a ground lead of the respective plurality of single in-line leads of the two or more pluralities of single in-line leads.

10. A semiconductor power device comprising:
    a lead frame unit having a top surface and a bottom surface opposite the top surface;
    two or more pluralities of single in-line leads arranged in a row near a side of the lead frame unit;
    two or more semiconductor chip stacks each including
        a high-side semiconductor chip having a top surface and a bottom surface, the bottom surface of the high-side semiconductor chip being attached to the top surface of the lead frame unit through a first layer of conductive bonding material;
        a first clip having a first end and a second end, a bottom surface of the first end of the first clip being attached to a source pad on the top surface of the high-side semiconductor chip through a second layer of conductive bonding material, and a bottom surface of the second end of the first clip being attached to a top surface of a phase note lead through a third layer of conductive bonding material; and
        a low-side semiconductor chip having a top surface and a bottom surface, the bottom surface of the low-side semiconductor chip being attached to the top surface of the first end of the first clip through a fourth layer of conductive bonding material; and
    a molding encapsulation;
    wherein a source pad on the top surface of the low-side semiconductor chip of said each of the two or more semiconductor chip stacks is electrically and mechanically connected to ground; and
    wherein the high-side and low-side semiconductor chips and the first clip of said each of the two or more semiconductor chip stacks and at least a majority portion of the lead frame unit are embedded in the molding encapsulation.

\* \* \* \* \*